(12) United States Patent
Nawaki et al.

(10) Patent No.: US 6,535,425 B2
(45) Date of Patent: Mar. 18, 2003

(54) NONVOLATILE SEMICONDUCTOR MEMORY DEVICE

(75) Inventors: Masaru Nawaki, Nara (JP); Makoto Ihara, Nara (JP); Toshiji Ishii, Sakurai (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 10/058,663

(22) Filed: Jan. 28, 2002

(65) Prior Publication Data
US 2002/0101762 A1 Aug. 1, 2002

(30) Foreign Application Priority Data

Jan. 29, 2001 (JP) .......................... 2001-020834
Feb. 26, 2001 (JP) .......................... 2001-051294

(51) Int. Cl.[7] .............................................. G11C 16/00
(52) U.S. Cl. .............................. 365/185.18; 365/185.2; 365/185.23
(58) Field of Search ....................... 365/185.23, 185.18, 365/189.11, 185.2

(56) References Cited
U.S. PATENT DOCUMENTS 6,128,231 A  * 10/2000 Chung ................... 365/185.23
6,144,589 A  * 11/2000 Micheloni et al. ..... 365/189.11
6,243,292 B1 *  6/2001 Kobayashi et al. .... 365/185.13

* cited by examiner

Primary Examiner—Tan T. Nguyen
(74) Attorney, Agent, or Firm—Morrison & Foerster LLP

(57) ABSTRACT

A nonvolatile semiconductor memory device of the present invention includes: a first booster circuit for generating a first voltage higher than a voltage supplied by an external power source, the first booster circuit being used for writing or deleting of data; a second booster circuit for generating a second voltage higher than the voltage supplied by the external power source, the second booster being used for reading of data; a regulator for controlling the first voltage, the regulator being connected to an output terminal of the first booster circuit; and a reference voltage generator circuit for generating a reference voltage input to the regulator. The nonvolatile semiconductor memory device is characterized in that: a power source of the reference voltage generator circuit is connected via a transistor to an output terminal of the second booster circuit; and the nonvolatile semiconductor memory device includes a section for allowing the transistor to be electrically conductive immediately after a start of an operation for writing or deleting of data.

4 Claims, 5 Drawing Sheets

NONVOLATILE SEMICONDUCTOR MEMORY DEVICE

CROSS-REFERENCE TO RELATED APPLICATIONS

This application claims priority to Japanese Patent Applications Number 2001-020834 and 2001-051294 filed Jan. 29, 2001 and Feb. 26, 2001, the content of which are incorporated herein by reference in their entirety.

BACKGROUND OF THE INVENTION

1. Field of the Invention

The present invention relates to a nonvolatile semiconductor memory device including a booster circuit for generating a high voltage and a reference voltage generator circuit for maintaining the voltage generated by the booster circuit at a constant level.

2. Description of the Related Art

In recent years, rewritable nonvolatile semiconductor memory devices (nonvolatile memories) represented by flash memories have been used in a variety of apparatuses, such as mobile phones, printers, network apparatuses, and have been widespread in the market. Hereinafter, the flash memory will be described as a representative nonvolatile memory.

In general, the flash memory includes a plurality of memory cells (only one is shown in FIG. 4) provided on the same substrate. As shown in FIG. 4, the memory cell includes: diffusion regions 21 and 22 which are source and drain regions, respectively; oxide films 23 and 25; a floating gate 24 having a function of holding charge, and being sandwiched between the oxide films 23 and 25 so that the floating gate 24 is in a state of complete insulation against electricity; and a control gate 26 provided on the oxide film 25. A voltage applied to the control gate 26 allows the charge to be injected into (programming=writing of data) and drawn from (deleting of data) the floating gate 24, and such a voltage also allows a memory cell selection when reading charge information stored in the floating gate 24.

Since the charge (electron) is generally carried by a tunnel current flowing through the oxide film 23 or by activated hot electrons, the oxide film 23 is also referred to as a tunnel film. The charge injected through the oxide film 23 into the floating gate 24 is almost permanently held in the floating gate 24 unless a specific electric field is applied to the floating gate 24. Thus, information written in the flash memory can be stored for a long period of time without applying a specific voltage for retaining the information.

As described above, writing or deleting of data in the flash memory are performed by the hot electrons or the tunnel current, and this involves the application of a high voltage to the control gate 26 and the source and drain regions 21 and 22. This high voltage is generally higher than a power source voltage applied to the flash memory by a normal power source (hereinafter, referred to as the "power source VCC"). When the flash memory has a memory capacity of up to several M (mega) bits, the high voltage is supplied via an external terminal (hereinafter, referred to as the "external terminal VPP") to the flash memory. Therefore, a system including the flash memory requires not only the normal power source VCC but also a power source which applies a high voltage used for writing or deleting of data via the external terminal VPP to the flash memory.

However, in mobile apparatuses which have come into wide use in recent years, it is difficult to include such a power source for generating a high voltage in addition to the normal power source VCC. Thus, in general, a flash memory of a latest model uses an internal booster circuit so as to internally generate a high voltage. Very recently, single-power source flash memories operated at a power source voltage of 1.8 V have appeared. Although it depends on a type of memory cells included in the flash memory, such a single-power source flash memory generally requires a high voltage equal to or more than 10 V as the internally-generated high voltage. Thus, in an apparatus including the single-power source flash memory, a booster circuit included in the single-power source flash memory generates a voltage equal to or more than 10 V using the power source voltage of 1.8 V.

Referring to FIG. 5, a process for programming a conventional flash memory cell will now be described. The conventional flash memory cell described in the following is a channel hot electron injection-type memory cell which is programmed using hot electrons.

FIG. 5 illustrates a schematic structure of a conventional flash memory including: a flash memory cell 1; an X-decoder 2; a Y-decoder 3; a source switch 4; regulators 5 and 6; booster circuits 7 and 9; a reference voltage generator circuit 8; a high voltage switch 10; a low-frequency oscillator circuit 11; and an OR gate 44.

The flash memory cell 1 includes: a drain terminal connected via a bit line to the Y-decoder 3, a gate terminal connected via a word line to the X-decoder 2, and a source terminal connected to the source switch 4. In practice, the flash memory includes a plurality of flash memory cells 1 provided in a matrix form and each flash memory 1 is selected by the X-decoder 2 and the Y-decoder 3. The source switch 4 is used for applying a high voltage to the source terminal of the flash memory cell 1 when deleting data in the flash memory cell 1 and is used for electrically connecting the source terminal of the flash memory cell 1 to ground when programming the flash memory cell 1 or reading data in the flash memory cell 1. The regulator 5 stabilizes (regulates) a high voltage 38 of about 10 V generated in the booster circuit 7 based on a reference signal 39 output by the reference voltage generator circuit 8 and the stabilized voltage is applied to an input terminal of the Y-decoder 3. The regulator 6 stabilizes the high voltage 38 of about 10 V generated in the booster circuit 7 based on the reference signal (voltage) 39 output by the reference voltage generator circuit 8 and the stabilized voltage is output from an output terminal of the regulator 6 to the high voltage switch 10 and then to an input terminal of the X-decoder 2. The booster circuit 9 supplies a voltage required for reading data via the high voltage switch 10 to the input terminal of the X-decoder 2.

Although the flash memories are classified into two types, i.e., NOR-type flash memories and NAND-type flash memories, by the positional arrangement of flash memory cells. In the NOR-type flash memory, a memory cell threshold voltage is required to be always positive for structural reasons. Moreover, a value of the threshold voltage varies within a range of several volts, and therefore, in order to correctly read data in all the memory cells, it is necessary to apply a voltage equal to or more than the threshold voltage to a gate of each memory cell. In general, the voltage equal to or more than the threshold voltage is about between 4 V and 5 V and the booster circuit 9 for reading is used to generate such a voltage. Moreover, while a voltage is applied to the flash memory by a power source, the voltage (output 37) required for reading is always required to be output from the output terminal of the booster circuit 9 for reading irrespective of whether the flash memory is on standby or in operation. The reason for this is that unlike the case of programming the flash memory or deleting data in the flash memory, time allowed for reading data in the flash memory is required to be 100 ns or less, but several hundred nanoseconds or more are required as a latency time until the booster circuit 9 is activated and generates a prescribed voltage.

Accordingly, the booster circuit 9 is required to continuously supply a constant voltage to the flash memory. However, in the case where the booster circuit 9 is caused to be continuously in operation, a current of several milliamperes (mA) is consumed even when the flash memory is on standby. Since the flash memory is often used in a mobile apparatus, a standby current thereof is required to be 100 µA or less at most. In order to realize the standby current of 100 µA or less, in general, the booster circuit 9 is intermittently operated using the low-frequency oscillator circuit 11.

FIG. 6 is a graph showing a timing of an output signal 41 (FIG. 5) by the low-frequency oscillator circuit 11. In FIG. 6, the horizontal axis represents time. The booster circuit 9 is in operation for a period of time denoted by $T_1$ and is not in operation for a period of time denoted by $T_2$. As the ratio of $T_2$ to $T_1$ ($T_2/T_1$) is increased, the period of time for which the booster circuit 9 is in operation is decreased, so that the standby current is reduced. However, when the period of time denoted by $T_2$ is too long, the period of time for which the booster circuit 9 is not in operation is increased. Thus, the voltage (output 37) required for reading stored at the output terminal of the booster circuit 9 is reduced by a parasitic junction leakage current in a signal of the voltage. Unless the junction leakage current is abnormal, the ratio of $T_2$ to $T_1$ can be 1,000 or more to 1.

Although the booster circuit 9 is required to be intermittently operated when the flash memory is on standby, the booster circuit 9 can be continuously in operation without requiring the intermittent operation when the flash memory is not on standby. As shown in FIG. 5, a signal 42 output by a chip selection terminal CE and the signal 41 output by the low-frequency oscillator circuit 11 are input to the OR gate 44. Thus, the OR gate 44 can calculate a logical summation of the signal 42 and the signal 41, and the OR gate 44 outputs a signal 40 to the booster circuit 9.

Referring to FIG. 7, transitions of principal signals used for programming (writing of data in) the conventional flash memory structured in the above-described manner will now be described. The programming of the flash memory is started by writing in the flash memory a program command output by the system including the flash memory. When the program command is input to the flash memory, a logic circuit (command user interface: CUI) (not shown) in the flash memory recognizes the program command and provides an instruction for the start of the programming to a write state machine (WSM) (not shown) in the flash memory, which is a control circuit for performing an automatic programming algorithmic process in the flash memory. The WSM performs a programming process on the flash memory cells based on the algorithm prestored in the WSM.

FIG. 7 is a timing graph for explaining an operation of the conventional flash memory. In FIG. 7, "A" denotes a starting point of the programming process by the WSM, "P" denotes a prescribed period of time for which a voltage is applied to the drain terminal of the flash memory cell 1 (FIG. 5), reference numeral 38 denotes an output (voltage) of the booster circuit 7, reference numeral 39 denotes a reference voltage generated by the reference voltage generator circuit 8, and reference numerals 31, 32, 34, and 35 respectively denote a voltage applied to: the drain terminal of the flash memory cell 1; the gate terminal of the flash memory cell 1; the input terminal of the Y-decoder 3 (FIG. 5); and the input terminal of the X-decoder 2 (FIG. 5). When the WSM starts the programming process at point A, the reference voltage generator circuit 8 generates the reference voltage 39. Once the reference voltage 39 is stabilized, the booster circuit 7 starts to operate. Almost simultaneously with this, the regulators 5 and 6 start to operate and output voltages 34 and 35 of the regulators 5 and 6 respectively provided to the input terminal of the Y-decoder 3 and the input terminal of the X-decoder 2 shortly reach a stability point. When the voltage 35 output to the input terminal of the X-decoder 2 by the regulator 6 reaches the stability point, the X-decoder 2 starts to select a word line. The voltage 35 stabilized by the regulator 6 is applied to, for example, the gate terminal of the flash memory cell 1. When the voltage applied to the gate terminal of the flash memory cell 1 is stabilized, the Y-decoder 3 starts to operate and the voltage 34 stabilized by the regulator 5 is applied via a bit line to the drain terminal of the flash memory cell 1. In the above-described voltage application state, a current flows from the drain terminal of the flash memory cell 1 to the source terminal of the flash memory cell 1 and hot electrons generated in the vicinity of the drain region 22 (FIG. 4) of the flash memory cell 1 are injected into the floating gate of the flash memory cell 1, so that the flash memory cell 1 is programmed.

In this case, the period of time P for which a voltage is applied via the bit line to the drain terminal of the flash memory cell 1 is predetermined. After a lapse of the period of time P, the WSM verifies whether or not the programming of the flash memory cell 1 has been correctly performed. In practice, it takes about between 10 µs and 20 µs in total for the flash memory to perform the setting of internal voltage, program pulse application and a verification operation. The above is the programming operation. During the programming operation of the flash memory, voltages applied to the word line and the bit line are required to be extremely accurately controlled so as to prevent breakdowns of internal transistors or decrease in reliability of the flash memory cells. Thus, the reference voltage 39 applied to the regulators 5 and 6 is required to be highly precise.

Referring to FIG. 8, the reference voltage generator circuit 8 (FIG. 5) for generating such a precise reference voltage 39 will now be described. In general, a bandgap circuit is often used as a reference voltage generator circuit. The bandgap circuit generates a reference voltage using a bandgap of a pn junction of silicon. However, in the flash memory, a reference voltage generator circuit including the flash memory cells is advantageous, and thus the reference voltage generator used in the present invention includes the flash memory cells. This is because, in such a reference voltage generator circuit including the flash memory cells, it is possible to adjust a threshold voltage of the flash memory after the completion of a wafer (i.e., after the wafer including the circuits as described above is formed as a flash memory) in the production step of the flash memory and to minimize variations in a level of the reference voltage due to differences among requirements for processes (before the completion of the wafer) in the production process.

In FIG. 8, the reference voltage generator circuit 8 includes: a booster circuit 20; flash memory cells 51 and 52; bias transistors 53 and 54; and p channel-type transistors 55 and 56; an output transistor 57; resistances 58 and 59; and a node 60. The bias transistors 53 and 54 respectively adjust a voltage applied to corresponding drain terminals of the flash memory cells 51 and 52 of the same size so as not to allow respective threshold voltages of the flash memory cells 51 and 52 to be changed over a period of time. Output terminals 61 and 62 of the bias transistors 53 and 54 are respectively connected to the corresponding drain terminals of the flash memory cells 51 and 52. A gate terminal 66 connected to both of the bias transistors 53 and 54 generally receives a voltage of about 2 V. The p channel-type transistors 55 and 56 serve as loads. A drain terminal 63 of the p channel-type transistor 55 is connected to both of gate terminals of the p channel-type transistors 55 and 56. A drain terminal of the p channel-type transistor 56 is connected to a gate terminal of the output transistor 57 directly controlling the output (reference voltage) 39. The resistances 58 and 59 divide the reference voltage 39 so as to feed back a voltage 65 resulted from the division by the resistances 58 and 59 to a gate terminal of the flash memory cell 51.

In the above-described case, by setting a threshold voltage of the flash memory cell 51 so as to be lower than that of the flash memory cell 52, the reference voltage generator circuit 8 is stabilized at an intersection point A shown in FIG. 9 where a current I1 flowing through the flash memory cell 51 and a current I2 flowing through the flash memory cell 52 have the same value. Accordingly, by slightly adjusting each threshold voltage (Vth) of the flash memory cells 51 and 52 at the time of the completion of the wafer, it is possible to produce desired reference voltages so as not to be affected by variations in levels of the reference voltages due to differences among requirements for processes before the completion of the wafer in the production process.

In the reference voltage generator circuit 8 shown in FIG. 8, in order to apply a current to each of the flash memory cells 51 and 52 and the p channel-type transistors 55 and 56 serving as loads and to prevent reduction in an output of the reference voltage generator circuit 8 due to a threshold voltage of the output transistor 57, it is necessary to apply a voltage of at least about between 5 V and 6 V to the node 60 through which a power source voltage is supplied to the reference voltage generator circuit 8. However, in the flash memory of a latest model, a voltage of substantially 3 V or substantially 1.8 V is generally used as the power source voltage. Accordingly, it is not possible to directly supply a voltage generated by the power source VCC to the reference voltage generator circuit 8, whereby the booster circuit 20 is used. When the booster circuit 20 receives via an input terminal 67 a command signal output by the WSM which represents a start of the programming, the booster circuit 20 starts to boost the power source voltage of substantially between 1.8 V and 3 V so as to be a voltage of about between 5 V and 6 V which is required for generating the reference voltage.

However, it takes a few microseconds (about between 1 $\mu$s and 2 $\mu$s) before the booster circuit 20 shown in FIG. 8 starts to charge the node 60 and a voltage applied to the node 60 reaches a prescribed voltage level (about between 5 V and 6 V). This period of time is a latency time for the booster circuit 7 shown in FIG. 5 and the booster circuit 7 does not start to generate a voltage during such a period of time. In general, time for the flash memory to be programmed for each byte is longer than that for writing data in a DRAM by almost two digits. The latency time further increases the entire programming time for the flash memory. In particular, as the power source voltage of the flash memory is decreased, the latency time is increases, so that the entire programming time for the flash memory is further increased.

SUMMARY OF THE INVENTION

According to one aspect of the present invention, there is provided a nonvolatile semiconductor memory device of the present invention including: a first booster circuit for generating a first voltage higher than a voltage supplied by an external power source, the first booster circuit being used for writing or deleting of data; a second booster circuit for generating a second voltage higher than the voltage supplied by the external power source, the second booster being used for reading of data; a regulator for controlling the first voltage, the regulator being connected to an output terminal of the first booster circuit; and a reference voltage generator circuit for generating a reference voltage input to the regulator. The nonvolatile semiconductor memory device is characterized in that: a power source of the reference voltage generator circuit is connected via a transistor to an output terminal of the second booster circuit; and the nonvolatile semiconductor memory device includes a section for allowing the transistor to be electrically conductive immediately after a start of an operation for writing or deleting of data.

According to the above-described structure, it is possible to reduce the number of circuit parts, such as a control circuit and the like, by using one booster circuit for reading data and generating a reference voltage, whereby it is possible to reduce the size of a flash memory chip.

According to one embodiment of the invention, the nonvolatile semiconductor memory device further includes: a control circuit for controlling a process of writing or deleting of data based on prestored algorithm; and a section for continuously keeping the second booster circuit in an active state during the process of writing or deleting of data according to a signal from the control circuit.

According to the above-described structure, it is possible to shorten a period of time for the booster circuit for generating the reference voltage to reach a prescribed voltage level, which is required in a conventional nonvolatile semiconductor memory device, whereby it is possible to shorten a programming time.

According to another embodiment of the invention, the nonvolatile semiconductor memory circuit is characterized in that the reference voltage generator circuit includes a first flash memory cell and a second flash memory cell, the reference voltage generator circuit generating the reference voltage using a difference in a threshold voltage between the first flash memory cell and the second flash memory cell, and wherein the first flash memory cell and the second flash memory cell operate at a voltage lower than the respective threshold voltage.

In the present invention, since an output voltage of the booster circuit for reading is used for generating a reference voltage, the reference voltage generator circuit is required to operate at a low voltage (about 4 V). According to the above-described structure, the reference voltage generator circuit can operate at such a low voltage. Even when one booster circuit is used for reading data and generating a reference voltage, it is possible to stably generate a desired voltage, thereby realizing low power consumption.

Thus, the invention described herein makes possible the advantages of providing a nonvolatile semiconductor memory device which can shorten a programming time and reduce a chip area thereof.

These and other advantages of the present invention will become apparent to those skilled in the art upon reading and understanding the following detailed description with reference to the accompanying figures.

DESCRIPTION OF THE PREFERRED EMBODIMENTS

Hereinafter, examples of the present invention will be described with reference to the drawings.

Figure 1:
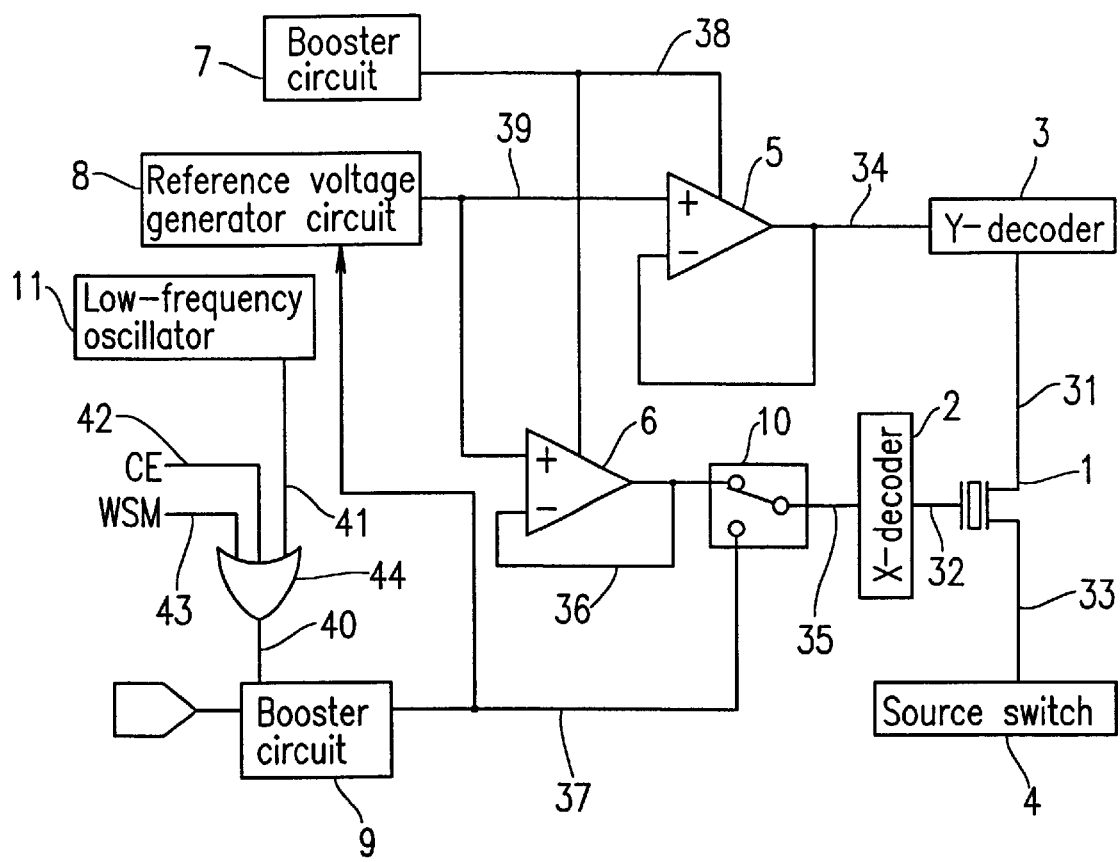
FIG. 1 is a block diagram illustrating a schematic structure of a flash memory according to an example of the present invention.

FIG. 1 is a block diagram illustrating a schematic structure of a flash memory which is one of examples of a nonvolatile semiconductor memory device according to the present invention. The flash memory shown in FIG. 1 includes: a flash memory cell 1; an X-decoder 2; a Y-decoder 3; a source switch 4; regulator circuits 5 and 6; a booster circuit 7 for generating a high voltage for programming or deleting; a reference voltage generator circuit 8; a booster circuit 9 for reading; a high voltage switch 10; a low-frequency oscillator circuit 11; and an OR gate 44.

Figure 5:
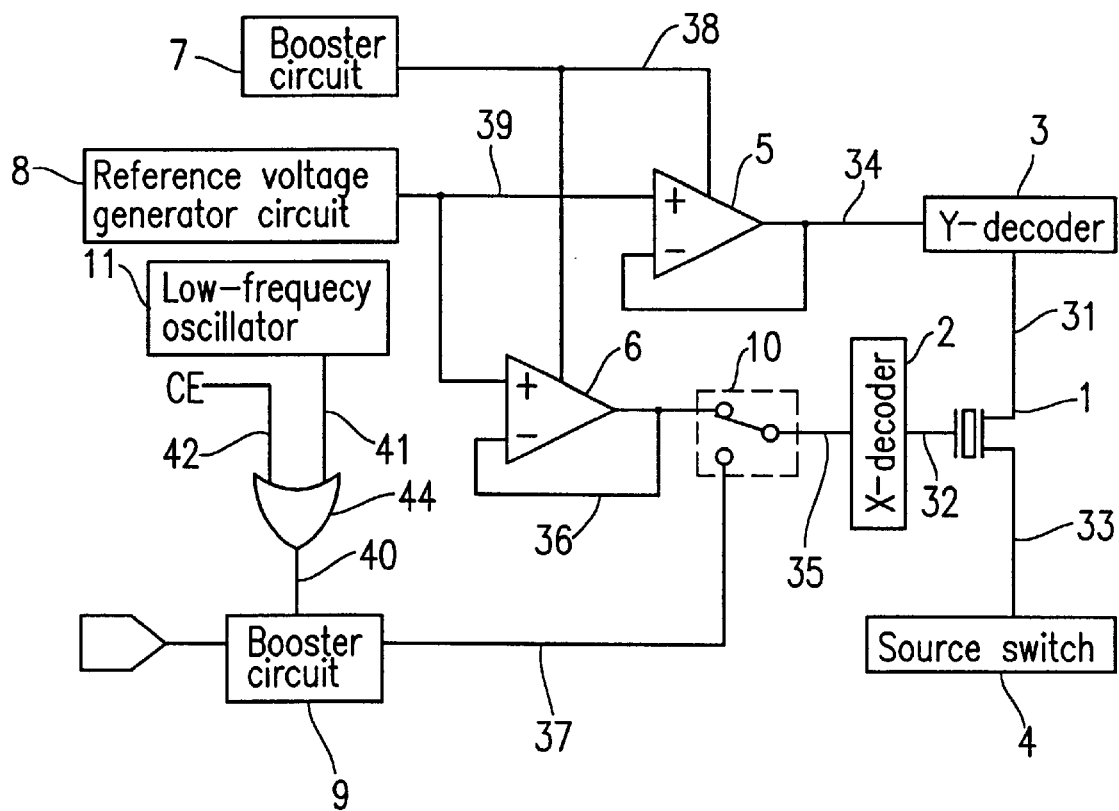
FIG. 5 is a block diagram illustrating a schematic structure of a conventional flash memory.
Figure 6:
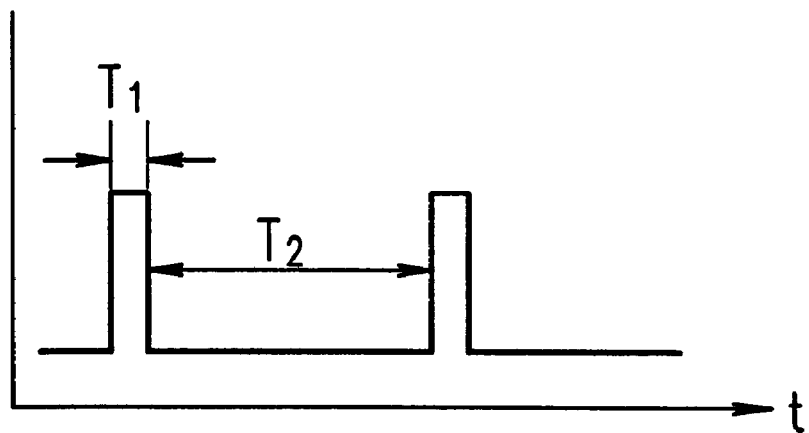
FIG. 6 is a timing graph used for explaining an operation of the conventional flash memory.
Figure 7:
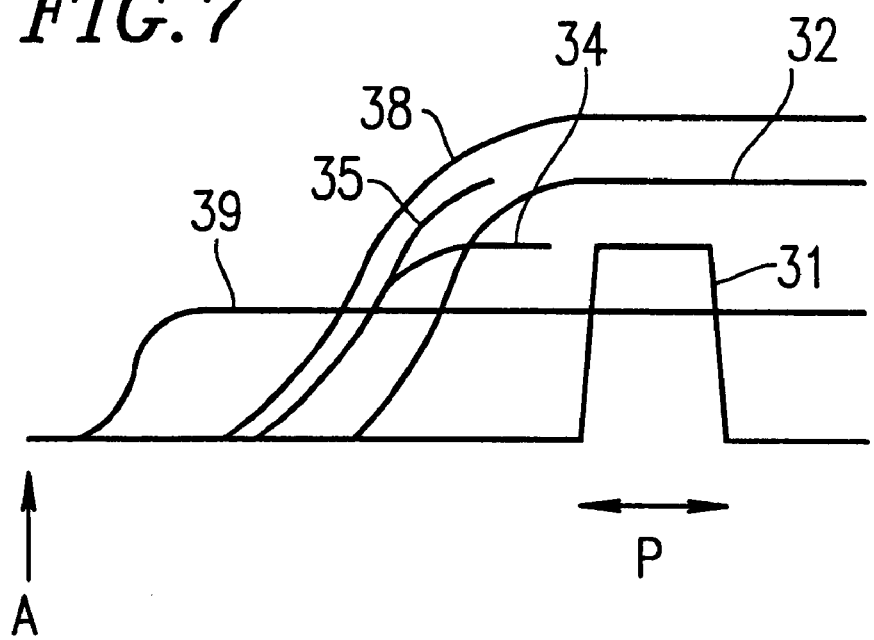
FIG. 7 is another timing graph used for explaining an operation of the conventional flash memory.

In FIG. 1, the circuit structure of the flash memory according to this example is similar to that of the flash memory shown in FIG. 5. That is, the flash memory cell 1 includes: a drain terminal connected via a bit line to the Y-decoder 3, a gate terminal connected via a word line to the X-decoder 2 and a source terminal connected to the source switch 4. In practice, the flash memory includes a plurality of flash memory cells 1 provided in a matrix form, and each flash memory 1 is selected by the X-decoder 2 and the Y-decoder 3. The source switch 4 is used for applying a high voltage to the source terminal of the flash memory cell 1 when deleting data in the flash memory cell 1 and is used for electrically connecting the source terminal of the flash memory cell 1 to ground when programming the flash memory cell 1 or reading data in the flash memory cell 1. The regulator 5 stabilizes (regulates) a high voltage 38 of about 10 V generated in the booster circuit 7 based on a reference signal (voltage) 39 output by the reference voltage generator circuit 8 and the stabilized voltage is applied to an input terminal of the Y-decoder 3. The regulator 6 stabilizes the high voltage 38 of about 10 V generated in the booster circuit 7 based on the reference signal 39 output by the reference voltage generator circuit 8 and the stabilized voltage is output from an output terminal of the regulator 6 to the high voltage switch 10 and then to an input terminal of the X-decoder 2. The booster circuit 9 supplies a voltage required for reading data via the high voltage switch 10 to the input terminal of the X-decoder 2.

Figure 2:
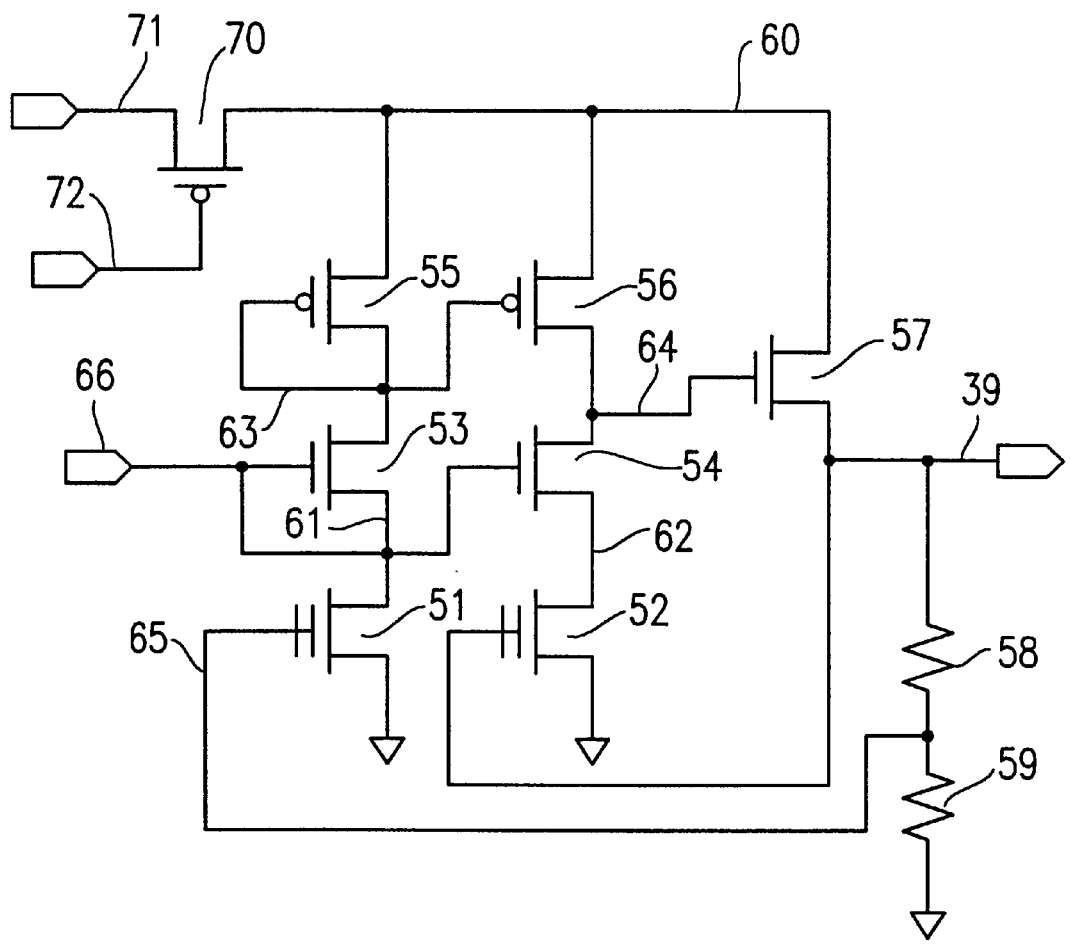
FIG. 2 is a circuit diagram illustrating a schematic structure of a reference voltage generator circuit in the flash memory according to the example of the present invention.
Figure 8:
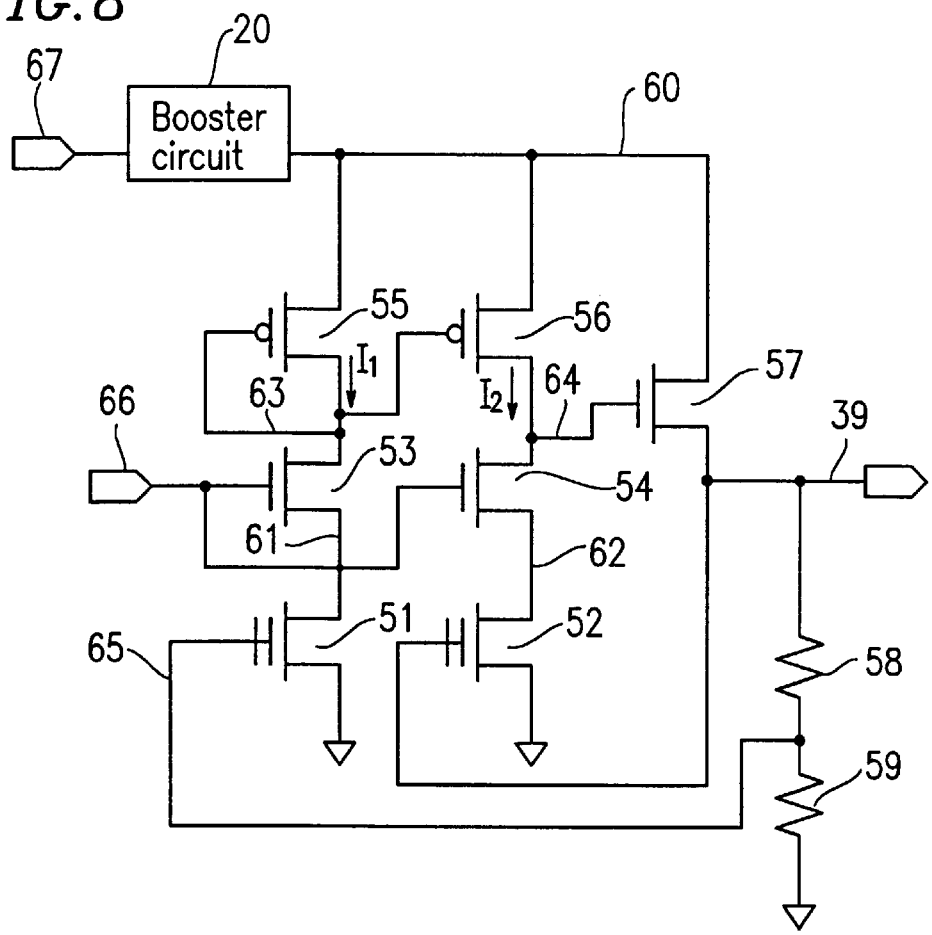
FIG. 8 is a circuit diagram illustrating a schematic structure of a conventional reference voltage generator circuit.

In the flash memory according to this example, the reference voltage generator circuit 8 has a structure differing from that of the conventional reference voltage generator circuit shown in FIG. 5 in that the reference voltage generator circuit 8 according to this example is designed to directly receive a voltage 37 output from an output terminal of the booster circuit 9 for reading. FIG. 2 illustrates an example of the reference voltage generator circuit 8 according to this example. The mechanism for generating a reference voltage in the reference voltage generator circuit 8 is the same as that in the conventional reference voltage generator circuit shown in FIG. 8 except that the mechanisms are partly different from each other with respect to principles of their operation. This reference voltage generator circuit 8 according to this example is structured so as to stably generate a desired voltage based on a difference in a threshold voltage between two flash memory cells 51 and 52 included in the reference voltage generator circuit 8.

In FIG. 2, the reference voltage generator circuit 8 includes: flash memory cells 51 and 52; bias transistors 53 and 54; and p channel-type transistors 55, 56 and 70; an output transistor 57; resistances 58 and 59; and a node 60. The bias transistors 53 and 54 respectively adjust a voltage applied to corresponding drain terminals of the flash memory cells 51 and 52 of the same size so as not to allow respective threshold voltages of the flash memory cells 51 and 52 to be changed over a period of time. Output terminals 61 and 62 of the bias transistors 53 and 54 are respectively connected to the corresponding drain terminals of the flash memory cells 51 and 52. A gate terminal 66 connected to both of the bias transistors 53 and 54 generally receives a voltage of about 2 V. The p channel-type transistors 55 and 56 serve as loads. A drain terminal 63 of the p channel-type transistor 55 is connected to both of gate terminals of the p channel-type transistors 55 and 56. A drain terminal of the p channel-type transistor 56 is connected to a gate terminal of the output transistor 57 directly controlling the output (reference voltage) 39. The resistances 58 and 59 divide the reference voltage 39 so as to feed back a voltage 65 resulted from the division by the resistances 58 and 59 to a gate terminal of the flash memory cell 51.

In the reference voltage generator circuit 8 shown in FIG. 2, the node 60 through which a power source voltage is supplied to the reference voltage generator circuit 8 is connected to the p channel-type transistor 70 rather than a booster circuit. The p-channel transistor 70 is activated by a start of a programming or deleting operation to conduct electricity.

Figure 9:
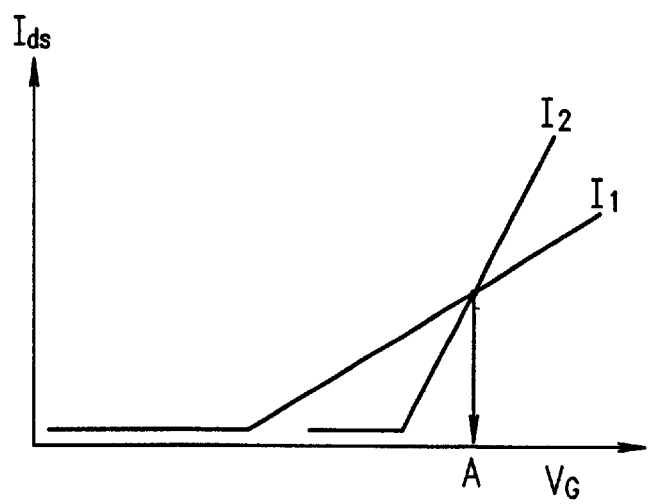
FIG. 9 is a graph used for explaining characteristics of a reference voltage generator circuit.

In the conventional reference voltage generator circuit, when a voltage of, for example, 3 V is generated as the output (reference voltage) 39, a threshold voltage of the flash memory cell 52 is set to 3 V so as to feed the output (reference voltage) 39 back to a gate terminal of the flash memory cell 52. Moreover, the threshold voltage of the flash memory cell 51 is set to 2 V such that the output (reference voltage) 39 is divided by the resistances 58 and 59 and two thirds of the reference voltage 39 (e.g., 2 V, when the reference voltage 39 is 3 V) are fed back to a gate terminal of the flash memory cell 51. In the reference voltage generator circuit 8 structured in this manner, the reference voltage generator circuit 8 is stabilized at an intersection point A shown in FIG. 9 where a current I1 flowing through the flash memory cell 51 and a current I2 flowing through the flash memory cell 52 have the same value. At the same time, a voltage equivalent to each threshold voltage of the flash memory cells 51 and 52 is fed back to the respective gate terminals of the flash memory cells 51 and 52, so that the flash memory cells 51 and 52 are stabilized.

However, in this example, the booster circuit 9 for reading is also used as a booster circuit for generating a reference voltage so as to stably generate a desired voltage.

Accordingly, when the conventional reference voltage generator circuit is used in this example and is operated at a low voltage of about 4 V which is output from the booster circuit 9 for reading, a voltage of about 3 V is applied to each drain terminal of the p channel-type transistors 55 and 56 serving as loads through which the currents $I_1$ and $I_2$ supplied to the flash memory cells 51 and 52. The gate terminal of the output transistor 57 is connected to the drain terminal of the p channel-type transistor 56 and, due to the threshold voltage of the output transistor 57, the output (reference voltage) 39 is reduced so as to be lower than the voltage applied to the drain terminal of the p channel-type transistor 56, whereby a voltage of substantially 3 V is not stably generated.

As described above, in the reference voltage generator circuit 8 according to the present invention, the booster circuit 9 for reading is also used as a booster circuit for generating a reference voltage. Thus, the reference voltage generator circuit 8 is required to be operated at a low voltage (about 4 V). For example, when a voltage of 2.2 V is generated as the output (reference voltage) 39, the threshold voltage of the flash memory cell 52 is set to 2.5 V so as to feed the output (reference voltage) 39 back to the gate terminal of the flash memory cell 52. Moreover, the threshold voltage of the flash memory cell 51 is set to 1.5 V such that the output (reference voltage) 39 is divided by the resistances 58 and 59 and six elevenths of the reference voltage 39 (e.g., 1.2 V, when the reference voltage 39 is 2.2 V) are fed back to the gate terminal of the flash memory cell 51. In the reference voltage generator circuit 8 structured in this manner, the reference voltage generator circuit 8 is stabilized at an intersection point A shown in FIG. 9 where a current I1 flowing through the flash memory cell 51 and a current I2 flowing through the flash memory cell 52 have the same value. At the same time, a voltage which is lower than each threshold voltage of the flash memory cells 51 and 52 by 0.3 V is fed back to the respective gate terminals of the flash memory cells 51 and 52, so that the flash memory cells 51 and 52 are stabilized. As a result, in comparison to the conventional case where a voltage equivalent to each threshold voltage of the flash memory cells 51 and 52 is fed back to the respective gate terminals of the flash memory cells 51 and 52, a current stably flowing through each of the flash memory cells 51 and 52 is reduced. Thus, even when the reference voltage generator circuit 8 is operated at a low voltage (about 4 V), a voltage 64 applied to the drain terminal of the p channel-type transistor 56 can be stable at a high voltage level. Moreover, even when the output (reference voltage) 39 is reduced due to the threshold voltage of the output transistor 57, the reference voltage 39 of 2.2 V is stably generated.

Even when a level of a voltage input as the reference voltage to each of the regulators 5 and 6 is different from a prescribed level of the reference voltage, the level of such a voltage can be adjusted, whereby the reference voltage is required to be stable rather than to be at the prescribed level. Accordingly, although the reference voltage used in this example is lower than that used in the conventional example, no problems would arise. Moreover, although a case where the voltage fed back to the flash memory cell 1 is lower than the threshold voltage by 0.3 V is described in this example, such a voltage can be different from the threshold voltage within a range of about between 0.1 V and 0.8 V depending on specifications of the reference voltage generator circuit 8 or conditions of the production processes. This is because if the difference between the reference voltage and the threshold voltage is small, the flash memory does not operate at a constant voltage, and if the difference is great, a current flowing to the flash memory cell 1 is too small, so that the reference voltage is caused to be unstable.

Referring to FIG. 1, a signal denoted by reference numeral 43 is output by the WSM which mainly serves to control the programming or deleting process using algorithm. The signal 43 is activated during a programming or deleting operation. The OR gate 44 can calculate a logical summation of the signal 43, a signal 42 output by a chip selection terminal CE and a signal 41 output by the low-frequency oscillator circuit 11, and the OR gate 44 outputs a signal 40 representing the logical summation in order to control the booster circuit 9. This allows the booster circuit 9 to operate during the programming or deleting operation and supply sufficient power for the reference voltage generator circuit 8 to generate a normal reference voltage 39.

Figure 3:
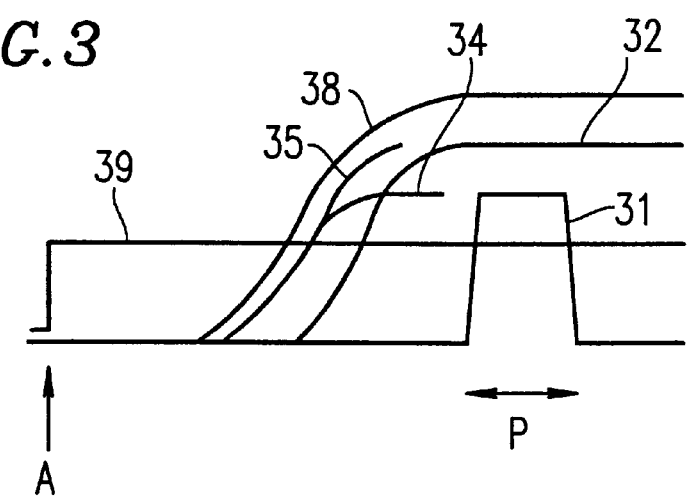
FIG. 3 is a timing graph used for explaining an operation of the flash memory according to the example of the present invention.
Figure 4:
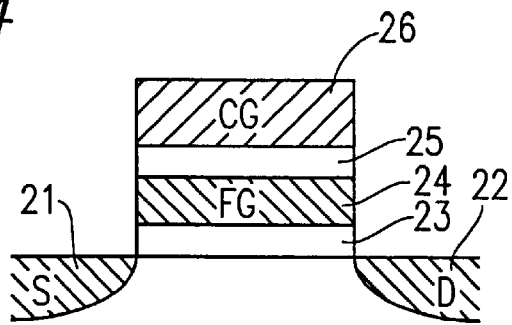
FIG. 4 is a cross-sectional view illustrating a structure of a general flash memory cell.

With the above-described structure, while a voltage is applied to the flash memory by a power source, a source terminal 71 (FIG. 2) of the p channel-type transistor 70 is charged by the booster circuit 9 for reading such that a voltage of about between 4 V and 5 V is always applied to the source terminal 71. Since the voltage of about between 4 V and 5 V is always generated by the booster circuit 9, there is no need to consider a time for a voltage applied to the booster circuit 9 to reach a prescribed voltage level. Moreover, the p channel-type transistor 70 is caused to be electrically conductive and the node 60 is charged when the programming is started, whereby it is possible to stabilize the output (reference voltage) 39 of the reference voltage generator circuit 8 at the prescribed voltage level in a short time. FIG. 3 is a timing graph showing transitions of levels of voltages in the above-described structure. In FIG. 3, "A" denotes a starting point of the programming process by the WSM, "P" denotes a prescribed period of time for which a voltage is applied to the drain terminal of the flash memory cell 1 (FIG. 1), reference numeral 38 denotes an output (voltage) of the booster circuit 7 (FIG. 1), reference numeral 39 denotes a reference voltage generated by the reference voltage generator circuit 8 (FIG. 1), and reference numerals 31, 32, 34, and 35 respectively denote a voltage applied to: the drain terminal of the flash memory cell 1; the gate terminal of the flash memory cell 1; the input terminal of the Y-decoder 3 (FIG. 1); and the input terminal of the X-decoder 2 (FIG. 1). From FIG. 3, it is understood that there is no latency time for the booster circuit 7, and thus the programming time is shortened.

Although a booster circuit for generating a reference voltage and a booster circuit for generating a voltage used for reading are separately required in the conventional structure, in the above-described structure, only one booster circuit is required. Accordingly, it is possible to reduce the number of control circuits such as a stabilizer circuit for an output voltage and the like which are similarly provided in both booster circuits, thereby contributing to reduction in a chip area of the flash memory.

As described in detail above, according to the present invention, by shortening a period of time substantially between 1 μs and 2 μs which is required for a voltage applied to a booster circuit for generating a reference voltage to reach a prescribed voltage level, the entire programming time, i.e., a period of time substantially between 10 μs and 20 μs which is required for program pulse application and a verification operation, can be shortened by 10% of the entire programming time. Moreover, although the booster circuit for generating a reference voltage and a booster circuit for generating a voltage used for reading are separately required in the conventional structure, in the above-described structure, only the booster circuit for generating a voltage used for reading is required. Accordingly, it is possible to reduce the number of circuit parts used, such as, control circuits provided in both booster circuits, thereby reducing a chip size or area of the flash memory.

Moreover, according to the present invention, it is possible to operate a reference voltage generator circuit at a low voltage. Even when a voltage output by the booster circuit for reading is used as a power source voltage for the reference voltage generator circuit, a voltage at a desired level can be generated and effects of reducing consumption power can be achieved by a low-voltage operation.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nonvolatile semiconductor memory device comprising:
   a first booster circuit for generating a first voltage higher than a voltage supplied by an external power source, the first booster circuit being used for writing or deleting of data;
   a second booster circuit for generating a second voltage higher than the voltage supplied by the external power source, the second booster being used for reading of data;
   a regulator for controlling the first voltage, the regulator being connected to an output terminal of the first booster circuit; and
   a reference voltage generator circuit for generating a reference voltage input to the regulator, and
   wherein the nonvolatile semiconductor memory device is characterized in that:
      a power source of the reference voltage generator circuit is connected via a transistor to an output terminal of the second booster circuit; and
      the nonvolatile semiconductor memory device includes a section for allowing the transistor to be electrically conductive immediately after a start of an operation for writing or deleting of data.

2. A nonvolatile semiconductor memory device according to claim 1, further comprising:
   a control circuit for controlling a process of writing or deleting of data based on prestored algorithm; and
   a section for continuously keeping the second booster circuit in an active state during the process of writing or deleting of data according to a signal from the control circuit.

3. A nonvolatile semiconductor memory circuit according to claim 2, characterized in that
   the reference voltage generator circuit includes a first flash memory cell and a second flash memory cell, the reference voltage generator circuit generating the reference voltage using a difference in a threshold voltage between the first flash memory cell and the second flash memory cell, and wherein
      the first flash memory cell and the second flash memory cell operate at a voltage lower than the respective threshold voltage.

4. A nonvolatile semiconductor memory circuit according to claim 1, characterized in that
   the reference voltage generator circuit includes a first flash memory cell and a second flash memory cell, the reference voltage generator circuit generating the reference voltage using a difference in a threshold voltage between the first flash memory cell and the second flash memory cell, and wherein
      the first flash memory cell and the second flash memory cell operate at a voltage lower than the respective threshold voltage.

* * * * *